United States Patent
Kadlec et al.

(10) Patent No.: US 8,435,389 B2
(45) Date of Patent: May 7, 2013

(54) RF SUBSTRATE BIAS WITH HIGH POWER IMPULSE MAGNETRON SPUTTERING (HIPIMS)

(75) Inventors: Stanislav Kadlec, Prague (CZ); Jürgen Weichart, Balzers (LI)

(73) Assignee: OC Oerlikon Balzers AG, Balzers (LI)

( * ) Notice: Subject to any disclaimer, the term of this patent is extended or adjusted under 35 U.S.C. 154(b) by 1452 days.

(21) Appl. No.: 11/954,490

(22) Filed: Dec. 12, 2007

(65) Prior Publication Data
US 2008/0135401 A1 Jun. 12, 2008

Related U.S. Application Data (60) Provisional application No. 60/869,912, filed on Dec. 14, 2006, provisional application No. 60/869,566, filed on Dec. 12, 2006, provisional application No. 60/869,578, filed on Dec. 12, 2006.

(51) Int. Cl.
| | |
|---|---|
| C23C 14/00 | (2006.01) |
| C23C 14/32 | (2006.01) |
| C25B 9/00 | (2006.01) |
| C25B 11/00 | (2006.01) |
| C25B 13/00 | (2006.01) |

(52) U.S. Cl.
USPC ............. 204/192.12; 204/192.13; 204/298.08

(58) Field of Classification Search ............. 204/192.12, 204/192.13, 298.03, 298.08
See application file for complete search history.

(56) References Cited

U.S. PATENT DOCUMENTS

| | | | |
|---|---|---|---|
| 4,963,239 A | 10/1990 | Shimamura et al. | |
| 6,297,165 B1 | 10/2001 | Okumura et al. | |
| 6,344,419 B1 * | 2/2002 | Forster et al. | 438/758 |
| 2003/0062254 A1 * | 4/2003 | Choi et al. | 204/192.3 |
| 2004/0112735 A1 * | 6/2004 | Saigal et al. | 204/192.12 |

FOREIGN PATENT DOCUMENTS

| | | |
|---|---|---|
| EP | 1106709 A2 | 6/2001 |
| WO | 0198553 A1 | 12/2001 |
| WO | WO 2005005684 A1 * | 1/2005 |
| WO | 2005010228 A3 | 2/2005 |
| WO | 2006049566 A1 | 5/2006 |

OTHER PUBLICATIONS

International Search Report for PCT/EP2007/063778 dated Nov. 11, 2008.
Written Opinion for PCT/EP2007/063778 dated Nov. 11, 2008.

(Continued)

*Primary Examiner* — Nicholas A Smith
*Assistant Examiner* — Michael Band
(74) *Attorney, Agent, or Firm* — Pearne & Gordon LLP (57) ABSTRACT

An apparatus for generating sputtering of a target to produce a coating on a substrate with a current density on a cathode of a magnetron between 0.1 and 10 A/cm² is provided. The apparatus comprises a power supply that is operably connected to the magnetron and at least one capacitor is operably connected to the power supply. A first switch is also provided. The first switch operably connects the power supply to the magnetron to charge the magnetron and the first switch is configured to charge the magnetron according to a first pulse. An electrical bias device is operably connected to the substrate and configured to apply a substrate bias.

5 Claims, 8 Drawing Sheets

OTHER PUBLICATIONS

Kouznetsov, V et al., "A Novel Pulsed Magnetron Sputter Technique Utilizing Very High Target Power Densities", Surface and Coatings Technology, Jan. 1, 1999, 290-293, vol. 122, Elsevier, Amsterdam, NL.

Helmersson et al., "Ionized Physical Vapor Deposition (IPVD): A Review of Technology and Applications", Thin Solid Films, Aug. 14, 2006, 1-24, vol. 513, Elsevier-Sequoia, Lausanne, CH.

* cited by examiner

FIG. 1

FIG. 2 Experiment: current pulse rise time as function of frequency. (upper graph: 500 Hz, middle: 100 Hz; bottom: 10 Hz)

FIG. 3

Fig. 4 RF off (prior art) upper graph: I; bottom graph: U

Fig.5 RF load power: 17 W self-bias 10V - upper graph: I; bottom graph: U

Fig.6 RF load power: 132W, self-bias 103V - upper graph: I; bottom graph: U

Fig.7 (process ID: HPMTa_18c) no RF bias. 1.7 μm top thickness, 251 nm bottom thickness, 15% bottom coverage.

Fig.8 (process ID: HPMTa_20e) 180W RF bias. 2.0 μm top thickness, 410 nm bottom thickness, 21% bottom coverage.

RF SUBSTRATE BIAS WITH HIGH POWER IMPULSE MAGNETRON SPUTTERING (HIPIMS)

CROSS-REFERENCE TO RELATED APPLICATIONS

This application claims the benefit of U.S. Provisional Application No. 60/869,912, filed Dec. 14, 2006, the entire disclosure of which is hereby incorporated herein by reference. This application also claims the benefit of U.S. Provisional Application No. 60/869,566, filed Dec. 12, 2006, the entire disclosure of which is hereby incorporated herein by reference. This application also claims the benefit of U.S. Provisional Application No. 60/869,578, filed Dec. 12, 2006, the entire disclosure of which is hereby incorporated herein by reference.

BACKGROUND OF THE INVENTION

The present invention relates generally to sputtering, and more particularly, to high power impulse magnetron sputtering (HIPIMS).

Sputtering is a physical process whereby atoms in a solid target material are ejected into the gas phase due to bombardment of the material by energetic ions. The process of sputtering is commonly used for thin-film deposition. The energetic ions for the sputtering process are supplied by a plasma that is induced in the sputtering equipment. In practice, a variety of techniques are used to modify the plasma properties, especially ion density, to achieve the optimum sputtering conditions. Some of the techniques that are used to modify the plasma properties include the usage of RF (radio frequency) alternating current, an AC power source, a DC power source, a superposition of DC and AC power sources, a pulsed DC power source such as a bipolar or unipolar power source, the utilization of magnetic fields, and the application of a bias voltage to the target.

Sputtering sources are usually magnetrons that utilize magnetic fields to trap electrons in a closed plasma loop close to the surface of a target. The electrons follow helical paths in a loop around the magnetic field lines. The electrons undergo more ionizing collisions with gaseous neutrals near the target surface than would otherwise occur. The sputter gas is inert, typically argon, though other gases can be used. The extra argon ions created as a result of these collisions leads to a relatively higher deposition rate. It is known to arrange strong permanent magnets beyond the target in order to create such a magnetic field loop. At the location of the plasma loop on the surface of the target, a racetrack can be formed, which is the area of preferred erosion of material. In order to increase material utilization, movable magnetic arrangements are being used, that allow for sweeping the plasma loop over relatively larger areas of the target.

Figure 1:
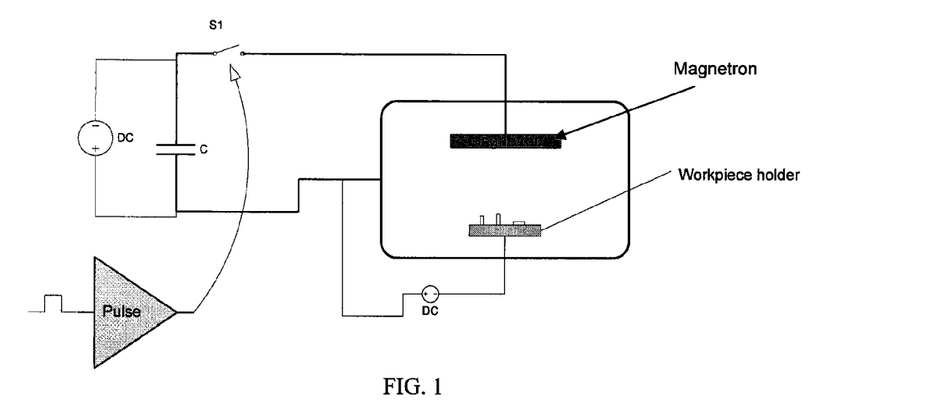
FIG. 1 is a prior art schematic of a HIPIMS application.

Direct current (DC) magnetron sputtering is a well-known technique using crossed electric and magnetic fields. An enhancement of DC magnetron sputtering is pulsed DC. The technique uses a so-called "chopper," where an inductor coil L and a switch are used to modify a DC power supply into a supply of unipolar or bipolar pulses, see FIG. 1. The inductor coil L is the chopper and can preferably include a tap located between the DC power supply and the magnetron cathode. The electronic switch S is periodically open and closed to create the pulses. In the on-time of the switch S, an effective shortcut between the tap of the coil L and the magnetron anode switches the negative cathode voltage off, preferably overshooting to positive voltages by the auto transforming effect of coil L. During the off-time, the current from the DC power supply continues to flow into the coil L and storing energy in its magnetic field. When the switch S is again off, a short negative high voltage peak is formed at the magnetron cathode. This helps for relatively fast reigniting of the magnetron plasma and restoring the original discharge current.

The High Power Impulse Magnetron Sputtering (HIPIMS) technology as described in the prior art uses relatively lower repetition frequency of pulses typically 5 Hz to 200 Hz, and pulse times 20 to 500 μs. The discharge peak currents range from 100 A for relatively small cathodes up to 4 kA for relatively large cathodes, which corresponds to current density at cathode in the order of magnitude of 0.1 to 10 A/cm$^2$. A common technique uses wiring as in FIG. 1. The work piece holder is either on an external potential, such as a DC potential, or the work piece holder is left on a floating potential in the plasma. The prior art design of FIG. 1 involves applying a DC bias to the workpiece holder.

There are a number of disadvantages with the standard HIPIMS technique. While using DC bias helps to define ion energy at a substrate, a disadvantage occurs in that arcing may occur on the substrate. Arcing on the substrate causes wafer damage when wafer processing is used. Another disadvantage is that DC bias also does not work on electrically insulating surfaces, such as trenches and vias using oxide materials.

Figure 2:
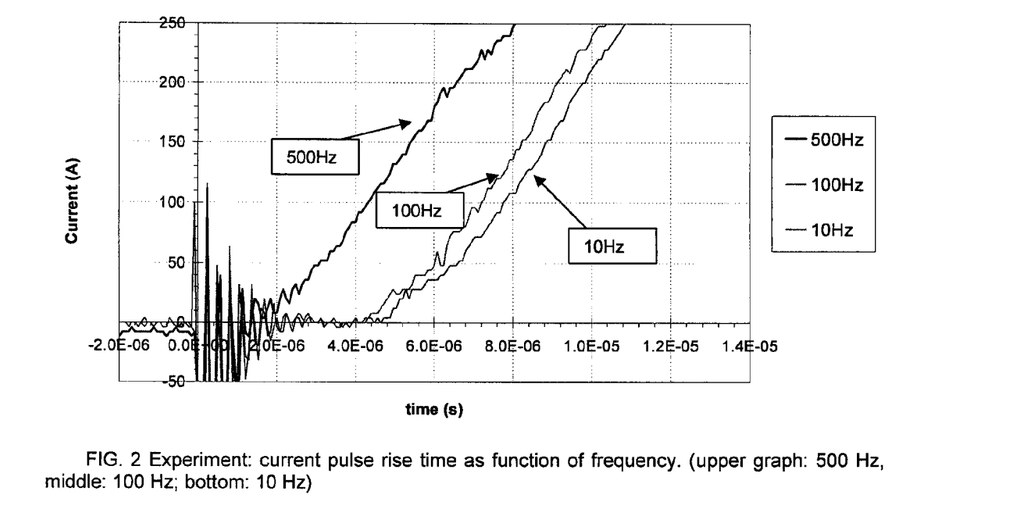
FIG. 2 is a plot illustrating the voltage and amps of an HIPIMS application in the prior art during a typical pulse.

FIG. 2 shows the result of an experiment. The data shows the measured rise time of the current as a function of frequency in a state of the art HIPIMS discharge. The target in this example was made of Tantalum (Ta), with the target having a diameter of 300 mm, and the experiment was using a rotating magnet array. For relatively low repetition frequency of 10 Hz (100 ms period), there is a relatively long delay (about 5 μs) between the start of the voltage pulse and the start of the current rise. The delay is somewhat shorter (over 4 μs) when a repetition frequency of 100 Hz (10 ms period) is used. With a relatively higher frequency of 500 Hz (2 ms period), the current starts to rise much faster, within only about 1.5 μs.

It has been shown that a pre-ionization using a radio frequency (RF) inductively coupled plasma (ICP) by the use of a coil placed between the target and the substrate helps to shorten the rise times of the current in an HIPIMS application. Nevertheless, placing a bulky ICP coil between the magnetron and the substrate complicates the design, increases the probability of particle formation, and reduces the deposition rate due to the increased target-substrate spacing.

BRIEF SUMMARY OF THE INVENTION

The following presents a simplified summary of the invention in order to provide a basic understanding of some example aspects of the invention. This summary is not an extensive overview of the invention. Moreover, this summary is not intended to identify critical elements of the invention nor delineate the scope of the invention. The sole purpose of the summary is to present some concepts of the invention in simplified form as a prelude to the more detailed description that is presented later.

In accordance with one aspect of the present invention, an apparatus for generating sputtering of a target to produce a coating on a substrate with a current density on a cathode of a magnetron between 0.1 and 10 A/cm$^2$ is provided. The apparatus comprises a power supply that is operably connected to the magnetron and at least one capacitor is operably connected to the power supply. A first switch is also provided. The first switch operably connects the power supply to the magnetron to charge the magnetron and the first switch is configured to charge the magnetron according to a first pulse. An electrical bias device is operably connected to the substrate and configured to apply a substrate bias.

In accordance with another aspect of the present invention, an apparatus for generating sputtering of a target to produce a coating on a substrate with a current density on a cathode of a magnetron between 0.1 and 10 A/cm$^2$ is provided. The apparatus comprises a power supply that is operably connected to the magnetron and at least one capacitor is operably connected to the power supply. A first switch is also provided. The first switch operably connects the power supply to the magnetron to charge the magnetron and the first switch is configured to charge the magnetron according to a first pulse. An electrical bias device is operably connected to the substrate and configured to apply a substrate bias. A chuck is operably connected to the electrical bias device where the substrate is located on the chuck. A coil is operably connected to the at least one capacitor. A second switch is operably connected to discharge the magnetron and connected at a point along the coil. The second switch is configured to discharge the magnetron according to a second pulse. At least one detector is operably connected to the magnetron where the at least one detector is configured for detecting an arc that is forming. The first switch and the second switch are controlled in response to a detection of the arc by the at least one detector to inhibit a formation of the arc.

In accordance with another aspect of the present invention, an apparatus for generating sputtering of a target to produce a coating on a substrate with a current density on a cathode of a magnetron between 0.1 and 10 A/cm$^2$ is provided. The apparatus comprises a power supply operably connected to the magnetron to charge the magnetron and configured for administering a first pulse to the magnetron. An RF electrical bias device is operably connected to the substrate and is configured to discharge the magnetron according to a bias pulse. A synchronization device is operably connected to the power supply and to the electrical bias device. The synchronization device is configured to synchronize the frequency and the time delay of the first pulse with the bias pulse.

In accordance with another aspect of the present invention, a method of applying a substrate bias in an apparatus for generating sputtering to produce a coating on a substrate with a current density on a cathode of a magnetron between 0.1 and 10 A/cm$^2$ is provided. The method includes the step of applying a first pulse to a first switch to charge a magnetron from a power supply. The method further includes the step of applying the substrate bias from an electrical bias device operably connected to the substrate.

BRIEF DESCRIPTION OF THE SEVERAL VIEWS OF THE DRAWINGS

The foregoing and other aspects of the present invention will become apparent to those skilled in the art to which the present invention relates upon reading the following description with reference to the accompanying drawings, in which.

DETAILED DESCRIPTION OF THE INVENTION

Examples that incorporate one or more aspects of the present invention are described and illustrated in the drawings. These illustrated examples are not intended to be a limitation on the present invention. For example, one or more aspects of the present invention can be utilized in other embodiments and even other types of devices. Moreover, certain terminology is used herein for convenience only and is not to be taken as a limitation on the present invention. Still further, in the drawings, the same reference numerals are employed for designating the same elements.

Figure 3:
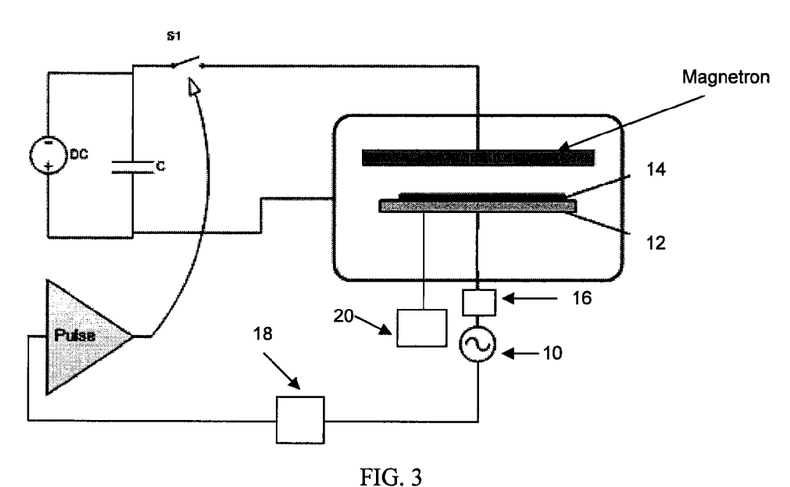
FIG. 3 is a first example schematic of the subject invention with an RF generator.

FIG. 3 shows a first example schematic of the subject invention. For example, the invention can use standard HIPIMS wiring, such as the wiring in FIG. 1, but in addition, an electrical bias device 10, such as an RF generator, is connected to a substrate 14. For example, the electrical bias device can be connected to a chuck 12 that holds the substrate 14. This first example can include a magnetron including a cathode and an anode, a target located near the magnetron where the target is used for sputtering atoms to produce the coating on the substrate, a power supply operably connected to the magnetron, at least one capacitor C operably connected to the power supply, and a first switch S1 operably connected to charge the magnetron and configured for administering a first pulse to the magnetron. Thus, the example of FIG. 3 involves using an electrical bias device 10, such as an RF generator, together with HIPIMS pulsing. In one example, the HIPIMS pulsing can be applied where the current density on the cathode of the magnetron is between 0.1 and 10 A/cm$^2$. The current density can be an area-average. In the example with the chuck 12, the chuck 12 can be a wafer pedestal which holds a substrate 14. The substrate 14 in this example is a wafer, but the substrate can also be other materials for other applications as well. The distance between the magnetron and the chuck 12 is relatively small and is generally between 20 mm to 100 mm. A test experiment was performed at 50 mm. Some magnetic field lines of the magnetron, preferably in the form of an unbalanced magnetron field, reach the chuck 12 with a magnetic field intensity of at least 10 Gauss. This way, magnetic confinement improves the stability of the RF discharge when the magnetron plasma is off. At the same time, the remaining RF discharge between pulses serves as a pre-ionization for the HIPIMS discharge, in one example method. The HIPIMS pulse can be provided in the example of FIG. 3 through the first switch S1 that is operably connected to charge a magnetron and is configured to charge the magnetron according to the first pulse.

In a further example of FIG. 3, a matching unit 16 can be placed between the electrical bias device 10 and the chuck 12. The matching unit 16 is configured to match the impedance of the plasma at the substrate and/or the chuck with the impedance of the substrate. Other locations of the matching unit 16 can also be used. In another example of FIG. 3, a RF self-bias monitoring device 20 can be operably connected to the chuck. Other locations of the monitoring device 20 can also be used. The RF self-bias monitoring device 20 is configured to monitor the RF self-bias at the chuck.

Combining an electrical bias device 10, such as an RF generator, connected to a chuck 12 can usually result in a relatively faster, more reliable ignition of an HIPIMS pulse. When the time delay between the pulses is shorter, the energy delivered for charging the capacitors between the pulses is relatively smaller and the capacitors can have a lower capacity, which results in relatively smaller dimensions and lower cost. Shorter pulses with relatively higher frequencies can be provided with use of the method of the subject invention.

Another advantage of using a RF bias, such as a capacitive RF bias, in comparison to a DC bias, is that the RF bias usually reduces or even eliminates arcing and substrate or wafer damage. Moreover, the RF bias works on insulating surfaces, such as in trenches and vias that use oxide materials. An additional advantage of using an RF bias over an ICP coil is that a shorter target-substrate distance can be used due to not requiring an ICP coil between the magnetron and the substrate. Moreover, a relatively higher deposition rate occurs due to the fact that fewer parts are in the reactor and as a result of a shorter target-substrate distance.

Figure 4:
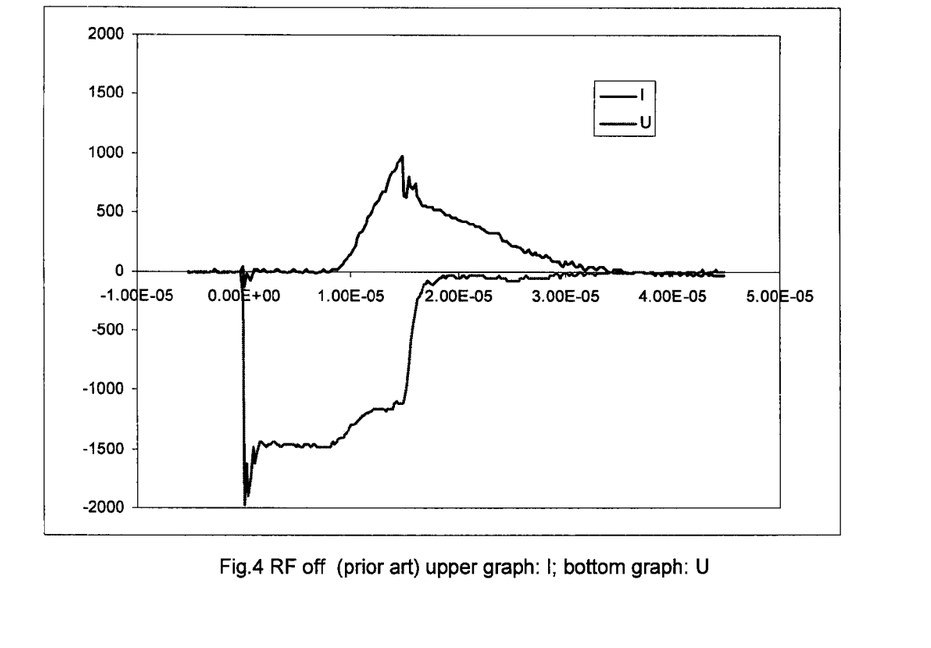
FIG. 4 is a plot illustrating the voltage and amps of an HIPIMS application in the prior art during a typical pulse when an RF is off.
Figure 5:
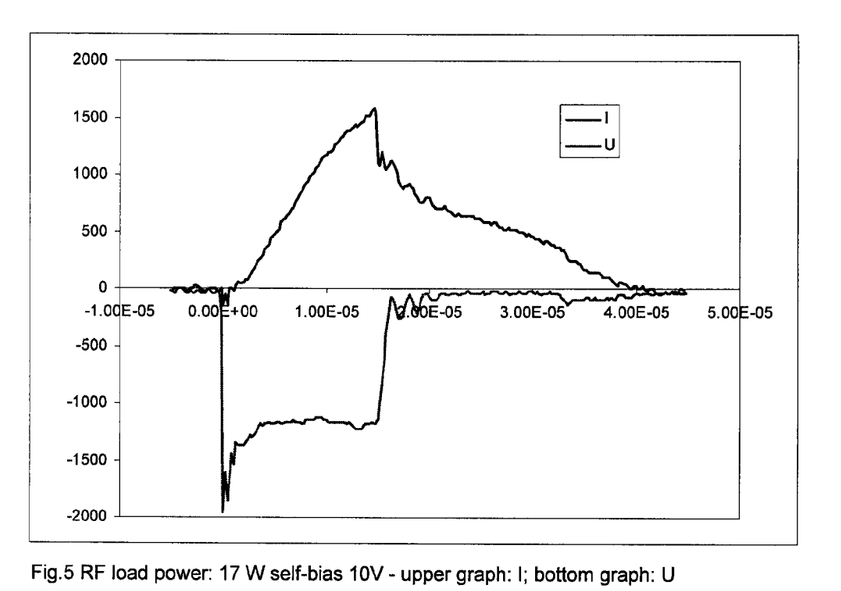
FIG. 5 is a plot illustrating the voltage and amps of an HIPIMS application during a typical pulse when a low power RF is used on the chuck of FIG. 3.
Figure 6:
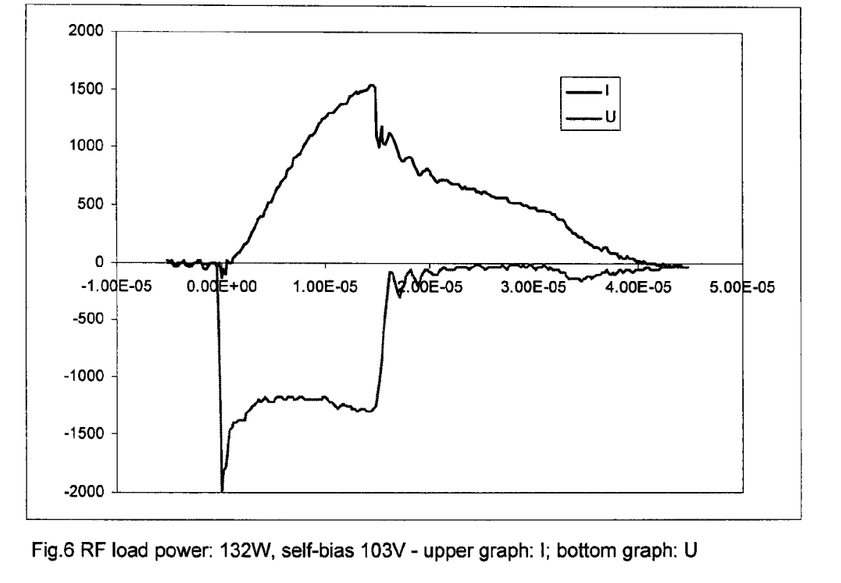
FIG. 6 is a plot illustrating the voltage and amps of an HIPIMS application during a typical pulse when a relatively higher power RF is used on the chuck of FIG. 3.

The plots of FIGS. 4-6 illustrate the benefit of providing an electrical bias device, such as a RF generator, connected to a chuck. FIGS. 4-6 were obtained by using an Oerlikon ClusterLine CL200 with a Cathode type ARQ151. The target for these example plots was made of Tantalum (Ta), with the target having a diameter of 300 mm. An argon gas, used as one example of an inert gas to be used with the apparatus, was used at a gas flow rate of approximately 25 sccm (standard cubic centimeter per minute) and with a gas flow rate of approximately 5 sccm between the chuck and the substrate to enable thermal control of the substrate. The gas flow rate is the amount of gas transferred into a chamber housing the target and the substrate. An effect of continuous pumping by a vacuum pump, in this example a cryogenic pump, results in steady-state pressure of approximately $6 \times 10^{-3}$ mbar. The pulse in the example plots has a frequency of 500 Hz, an on-time of 15 µs, and a voltage of approximately 1400V. Thus, this frequency can be applied through the first pulse.

FIG. 4 shows a plot illustrating the voltage and amps of an HIPIMS application in the prior art during a typical pulse without the use of an electrical bias device, such as a RF generator. FIG. 4 thus is an example of the prior art and shows a typical delay of about 10 µs for the current to rise during a HIPIMS pulse. Only in the last 5 µs of the on-time does the current rise to a peak value of approximately 980 A.

FIG. 5 shows a plot illustrating the voltage and amps of an HIPIMS application during a typical pulse when an RF generator is used to apply a relatively lower power RF load of 17 W with a self-bias of 10V is used on the chuck of FIG. 3. Both the RF power load and self-bias voltage mentioned here are time-averaged values determined over several pulse periods. When the low power RF is used on the chuck, the delay between the start of a pulse, such as during the first pulse, and the beginning of the current rising is much shorter, as it is approximately 1.8 µs. The current in this example rises to a much higher peak current value of approximately 1580 A, in comparison to the peak value of 980 A when an RF is not used. In other examples of this experiment, other operational ranges can provide similar results. For example, an RF load of 10 W to 50 W with a self-bias of 5V to 50V can result in a delay of less than 2 µs with a range of increased peak values over 500 A.

FIG. 6 shows a plot illustrating the voltage and amps of an HIPIMS application during a typical pulse when a relatively higher power RF of 132 W with a self-bias of 103V is used on the chuck of FIG. 3, again measured as time-average. When the relatively high power RF is used on the chuck, the delay for the current beginning to rise between the start of a pulse, such as during the first pulse, and the beginning of the current rising, is even shorter than in the lower power RF application of FIG. 5, as the delay is approximately 0.8 µs. The current rises even relatively faster and the higher RF power usually results in a relatively higher self-bias potential of approximately 103V. The peak value of the current is approximately 1500 A in this example. By adjusting the self-bias voltage, the energy of ions bombarding the substrate, such as a wafer, can now be regulated. Thus, the self-bias voltage can be adjusted to provide a desired coating for the substrate. In other examples of this experiment, other operational ranges can provide similar results. For example, a load of more than 50 W with a self-bias of more than 50V can result in a delay of less than 1 µs.

Providing RF power also enables the HIPIMS impulse, applied by the first switch S1, to start at a relatively lower pressure range. For example, an experiment performed with only an argon gas flow rate of approximately 15 sccm without an electrical bias device, such as an RF generator, failed to create an HIPIMS impulse. The gas pressure corresponding to this flow rate was about $3 \times 10^{-3}$ mbar. However, a HIPIMS impulse can occur with an RF power of greater than 50 W under the same argon gas flow conditions. With an RF power of greater than 50 W, the HIPIMS impulse starts repeatedly. Other low pressure operations are also possible and the argon gas flow of 15 sccm is just one example of an application of the subject invention. The RF load of greater than 50 W can also occur at any gas flow rate of less than 20 sccm. Similarly, the RF load of greater than 50 W can occur at various gas pressures. The gas pressure, in one example, can be in the range of approximately $2 \times 10^{-4}$ to $5 \times 10^{-3}$ mbar, which is equivalent to $2 \times 10^{-2}$ to $5 \times 10^{-1}$ Pa.

Figure 7:
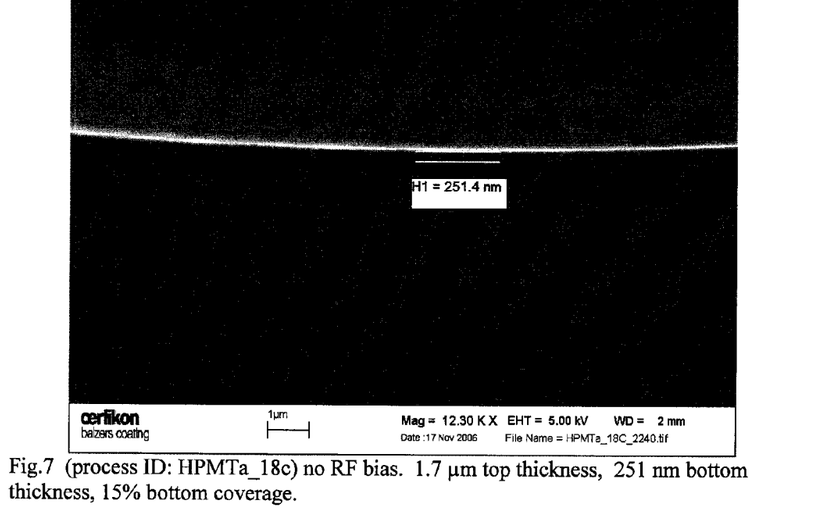
FIG. 7 is a schematic of an HIPIMS application showing the bottom thickness of the substrate when no RF bias is used.
Figure 8:
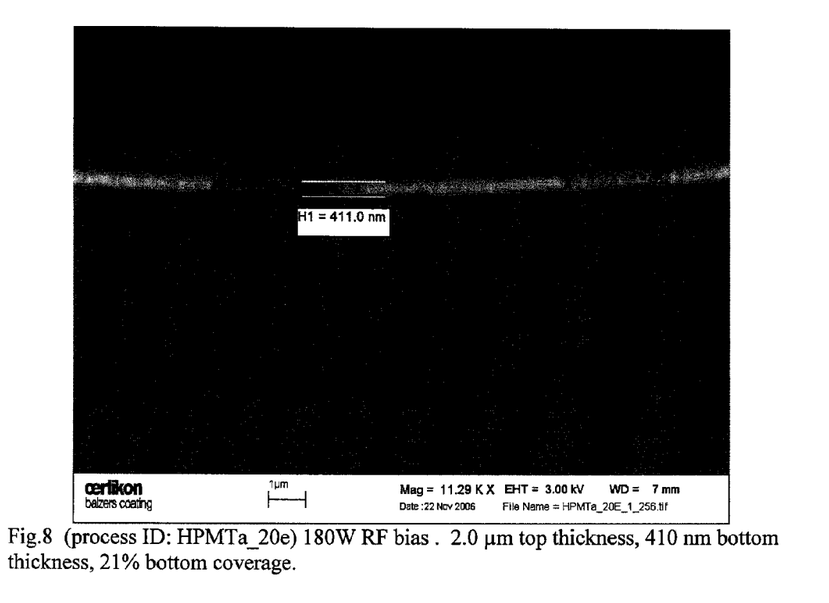
FIG. 8 is a schematic of an HIPIMS application showing the bottom thickness of the substrate when RF bias is used.

Another benefit of providing RF power is that better bottom coverage of target occurs by use of the subject invention. An experiment, the results of which are shown in FIG. 7 and FIG. 8, illustrate the improved bottom coverage of the target. In this experiment, a Tantalum (Ta) target was used for deposition of a trench of approximately 180 µm deep and 50 µm wide. FIG. 7 shows the results of coverage on the substrate without the use of RF bias. FIG. 7 shows that a bottom thickness of approximately 251 nm was measured. In addition, the top thickness was measured at only 1.7 µm, resulting in only approximately 15% bottom coverage. In FIG. 8, the results of using RF bias is shown. This resulted in a bottom thickness of approximately 410 nm and a top thickness of 2.0 µm giving an improved approximate 21% bottom coverage. The improvement that occurs in the coverage of the bottom of the substrate is due to a RF sheath that is formed close to the surface of the chuck and the substrate surface. When the RF sheath is formed close to the surface of the chuck, it results in the attraction of ionized metal ions towards the surfaces of the substrate and the chuck. As a result, more ions become directed in the sheath to bombard the surface and/or their angular spread gets narrower.

An example method of the subject invention involves applying a substrate bias in an apparatus for generating sputtering where pulses are applied to produce a coating on a substrate. One step in this method is to apply a first pulse to a first switch to charge a magnetron from a power supply. Another step in this example method is to apply a substrate bias from an electrical bias device that is operably connected to the substrate. The example method can also include the step of using an RF discharge of the RF generator during the first pulse, or rather, between pulses occurring with the first pulse pattern. Using the RF discharge during the first pulse, such as the HIPIMS pulse, will achieve a pre-ionization for the discharge of the magnetron. In another example application of the subject invention, the RF power can be utilized to etch and pre-clean the substrate prior to deposition. Etching of a substrate, such as selective sputtering or sputter-cleaning of topmost layers such as surface oxides, can be done under a closed shutter to avoid contamination of the target. Deposition of the substrate can then start after the shutter is opened. In another example application of the method, the method can further include the step of adjusting a voltage of the substrate bias to regulate the energy of ions bombarding the substrate to provide a desired coating for the substrate.

In another example application of the subject invention, the RF power can be applied in a pulsed mode of operation. In this example, it is preferable to use a relatively higher power for the RF of more than 200 W, preferably 500 W to 10 kW peak power. While running the RF in the pulsed mode of operation, the apparatus can be synchronized with the HIPIMS pulsing. In a preferable operation, the RF pulse can be started first, and then the HIPIMS magnetron pulse can be applied through the use of the first switch S1. The RF pulse can be switched off before the HIPIMS voltage pulse switches off. Alternatively, the RF pulse can be switched off after the HIPIMS voltage pulse switches off. In the example of synchronizing the RF power with HIPIMS pulsing, an apparatus can include a magnetron, a power supply, a RF electrical bias device 10, and a synchronization device 18. The power supply is operably connected to the magnetron to charge magnetron and is configured for administering a first pulse to the magnetron. The pulsed power supply can include a first switch operably connecting the power supply to the magnetron where the first switch is configured for administering a first pulse to the magnetron. Other structures can be used to apply the first pulse as well. The RF electrical bias device is operably connected to the substrate and is configured to discharge the magnetron according to a bias pulse. The synchronization device 18 is operably connected to the power supply and to the electrical bias device 10, as seen in the example of FIG. 3. The synchronization device 18 is configured to synchronize a frequency and a time delay of the first pulse with the bias pulse. For example, the frequency and the time delay of the first pulse can be altered variously based on different types of bias pulses. In a further example, the power supply is configured for administering the first pulse to the magnetron with a duty cycle for the first pulse between approximately 0.01% and 20% and a frequency in the range of approximately 1 Hz to 20 kHz. In another further example, the power supply is configured for administering the first pulse to the magnetron with a duty cycle for the first pulse between approximately 2% and 50%. In another example, the synchronization device can be configured to administer the bias pulse before the first pulse is administered, with a time delay of approximately 0.1 µs to 500 µs.

Figure 9:
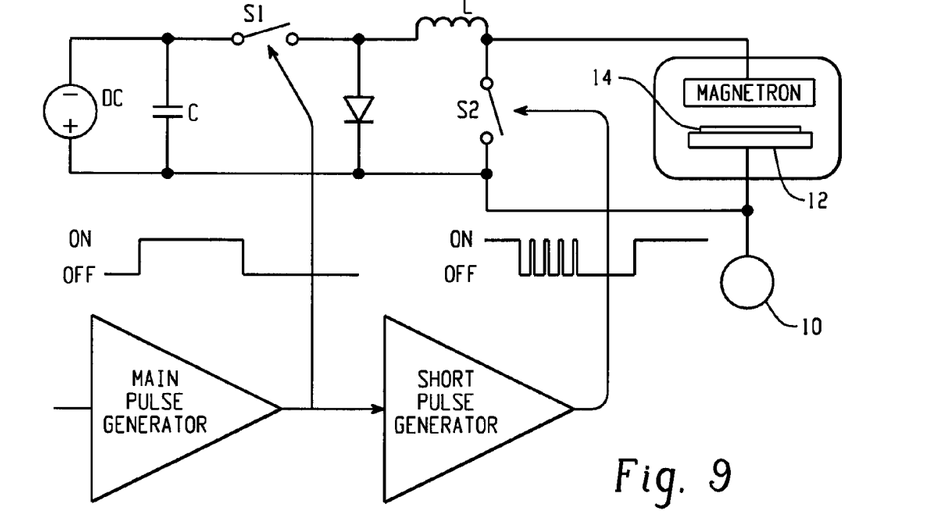
FIG. 9 is a second example schematic of the subject invention using RF bias in combination with two switches for applying different modes.

In a second example, the method and the device of the subject invention of providing an electrical bias device 10 can be combined with two switches for applying varying modes, including HIPIMS and a high frequency HIPIMS mode, as seen in FIG. 9. The electrical bias device 10, such as an RF generator, is operably connected to the substrate 14, such as to a chuck 12 which holds the substrate 14. The example of the subject invention of FIG. 9 includes a first switch S1 and a second switch S2 in this design. The first switch S1 is operably connected to charge the magnetron and is configured to administer a first voltage and can charge the magnetron according to a first pulse. The second switch S2 is operably connected to discharge the magnetron and can be configured to discharge the magnetron according to a second pulse. An inductance is also provided in this example and is operably connected to the at least one capacitor. The inductance in this example is a coil L though it is appreciated that other structures can be used to provide the inductance. The coil L limits the slope of the magnetron discharge current rise. The coil L also limits the peak current when an arc occurs.

Figure 10:
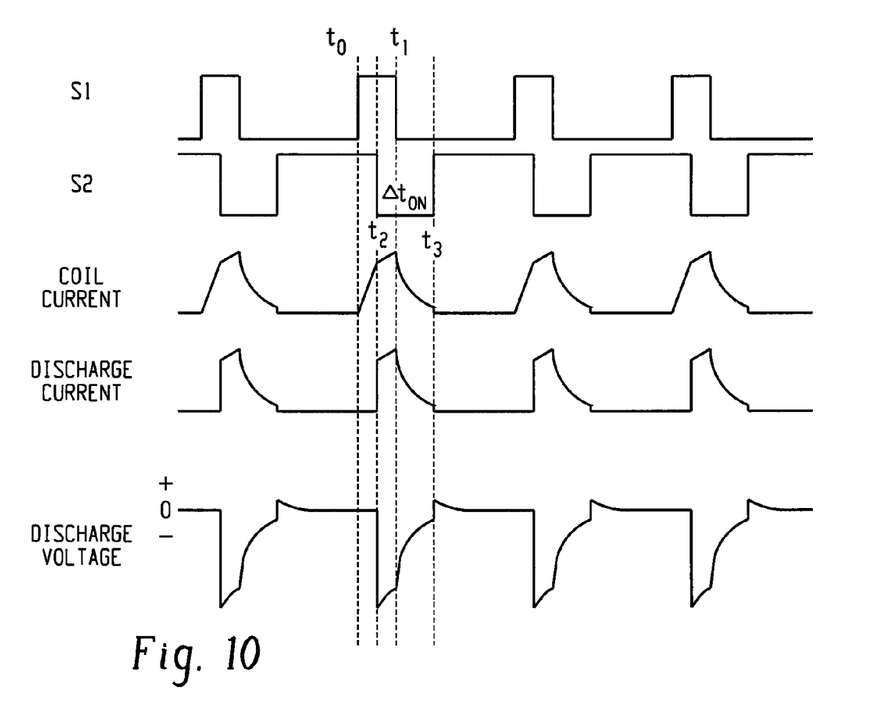
FIG. 10 is an example schematic of a high frequency mode for use with FIG. 9.

There are several modes of operation using the example of FIG. 9. In one mode of operation for the example of FIG. 9, shown in FIG. 10, pulse form for the first switch S1, the first pulse, has a high frequency. Example pulse shapes for the first pulse of the first switch S1 and the second pulse of the second switch S2 are shown in the schematic of FIG. 10 for this high frequency mode. The high frequency mode of FIG. 10 can be operated at different levels, including a high frequency pulsed operation of 200 Hz-100 kHz, with preferable examples occurring between 1 kHz to 20 kHz. A relatively low effective duty cycle (0.1% to 10%) with lower power losses can also be achieved in this mode. An on-time (time period of $t_1-t_0$) of 0.2 µs to 100 µs can be used in this example, with preferable examples occurring from 2 µs to 40 µs.

The high frequency mode can start with connecting the charged capacitor C to the coil L at time $t_0$. It is appreciated that the charged capacitor can be at least one capacitor and the drawings can refer to a plurality of capacitors. Activating the switch S2 to be opened at time $t_2$ ignites the plasma, after a delay of time $(t_2-t_0)$. The energy stored in the coil L can result in a voltage overshoot that occurs almost immediately on the magnetron cathode and in a relatively faster rise time of the magnetron current, as shown in the example of FIG. 10. The magnetron discharge current decays between time $t_1$ (S1 is off) and $t_3$ (S2 is on). The time $t_3$ can be chosen between short times after $t_1$ to relatively long times, including the rest of the period. Each first pulse in the example mode of FIG. 10 starts with the voltage overshoot and the relatively fast rise of current during the same initial time period of $(t_2-t_0)$. The energy effectiveness is reached by a relatively long off-time for the first switch S1 that is used for charging the capacitor C. This time period is shown by the period before to occurs. The initial time period $(t_2-t_0)$ is relatively short and is used to store energy in the coil L. The relatively short time elapses when the first switch S1 is activated to store energy in the coil L before the second pulse activates the second switch S2. The activation of the second switch S2 causes a discharging of the magnetron. From a time $t_0-t_1$ the charge of the capacitor C loads the coil L and discharging of the current of the magnetron takes place. Specifically, the magnetron discharge takes place from a time $t_2-t_3$. From a time $t_1-t_3$ the rest energy from the coil L is discharged into the magnetron.

Figure 11:
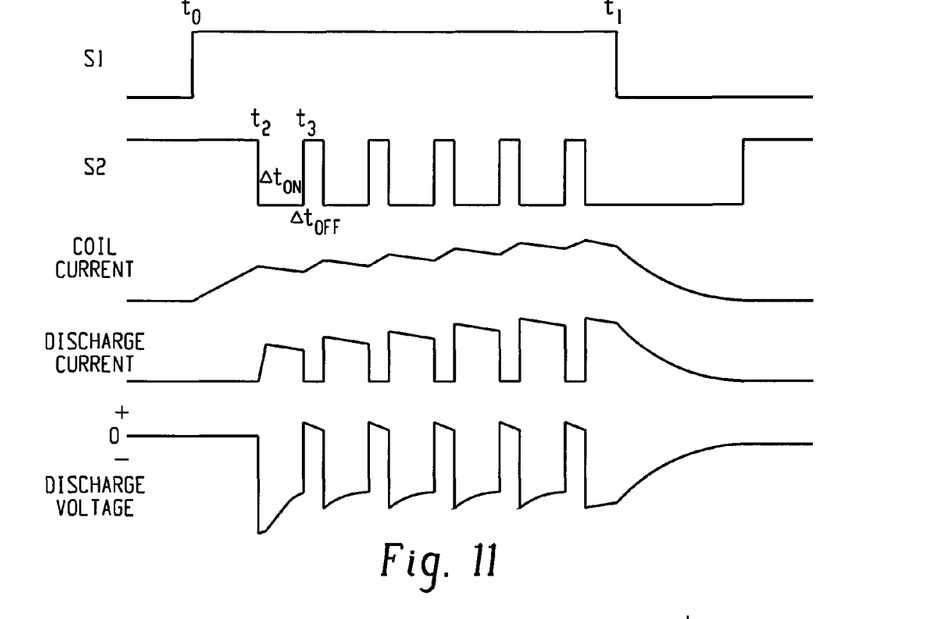
FIG. 11 is an example schematic of a multiple sub-pulse mode within a main pulse that is used with FIG. 9.

A second mode of operation for the example of FIG. 9 is shown in FIG. 11. In this mode, the second pulse exerts multiple sub-pulses that are formed within one main HIPIMS pulse of the first pulse. The first pulse can be a single, relatively long pulse to administer a voltage to the magnetron, and the first pulse is formed by using the first switch S1, during the time period $t_1-t_0$. The second pulse can be a multiple of sub-pulses, or a series of shorter sub-pulses, that are then formed at switch S2, as shown in the example of the mode in FIG. 11. The mode of FIG. 11 can be operated at different levels, including a main frequency of 1 Hz-10 kHz, with preferable examples occurring between 10 Hz to 1 kHz. The first pulse has a duty cycle (0.1% to 10%) can be used in this mode. In this mode, an on-time (time period of $t_1-t_0$) of 0.2 μs to 100 μs, preferably 2 μs to 20 μs can be used. The second pulse on-time (time period of $t_3-t_2$, which is equal to $\Delta t_{on}$) can be 0.2 μs to 100 μs, with preferable examples of 2 μs to 20 μs. Similarly, the second pulse off-time (time period of $\Delta t_{off}$) can be 0.2 μs to 100 μs, with preferable examples of 2 μs to 20 μs. Many examples of the mode are present, as the second pulse duty cycle can have a wide range of values. For example, the second pulse duty cycle ($\Delta t_{on}/(\Delta t_{on}+\Delta t_{off})$) can range from 30% to 99%. It is thus appreciated that many different types of pulse configurations can be devised involving different types of constant and varied time periods for the second pulses. For example, even the $\Delta t_{on}$ can have different amounts of time during each second pulse within a single main HIPIMS pulse of S1.

During operation of the second mode example of FIG. 11, the time period $t_1-t_0$ is used to charge the capacitor C, load the coil L, and discharge the current of the magnetron. The second pulse, or rather the first sub-pulse, can start with a proper delay when the switch S2 opens. During the time $t_0-t_2$, the charge of the capacitor C loads the coil L only. The energy stored in the coil L can result in a voltage overshoot on the magnetron cathode and in a relatively faster rise time of the magnetron current. The second pulse then can exert a sequence of shorter pulses by switching S2 open and closed. Each of the pulses within the second pulse can start with a voltage overshoot and a relatively fast rise of current. Specifically, the magnetron discharge takes place from a time $t_2-t_3$, each time S2 is turned on. During the time period $t_1-t_3$, the energy from the coil L is discharged into the magnetron. At the end of the sub-pulse series of the second pulse, the magnetron discharge current decays after time $t_1$, when switch S1 is turned off, until the rest of the energy stored in the coil L is discharged. During the off time of switch S1 before to, the capacitors C are being charged and the plasma density decays without any energy input.

Figure 12:
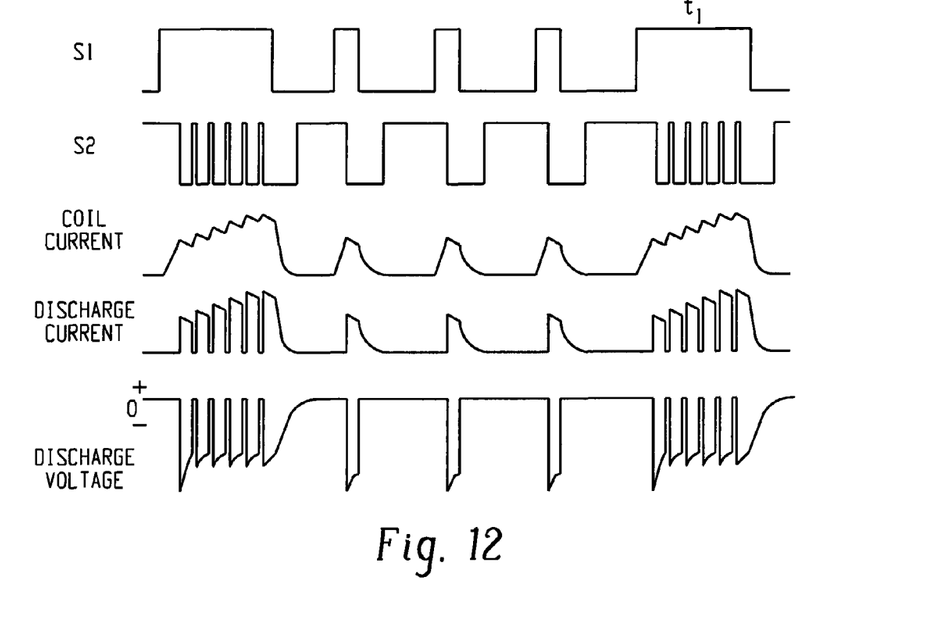
FIG. 12 is an example schematic of a pulsed pre-ionization mode for use with FIG. 9.

A third mode of operation of FIG. 9 is shown in FIG. 12. This mode can be referred to as a pulsed pre-ionization mode. This mode is an alternating sequence of the first mode of FIG. 10 with the second mode of FIG. 11 in that multiple sub-pulses of the second pulse are formed within a first pulse, according to the mode of FIG. 10, being the main HIPIMS pulse. This way, there are pulses similar to the first mode within the second pulse that can be used during the first pulse of the switch S1 to ensure that the decay of plasma density is not too rapid by still keeping the average discharge power low. Thus, this example mode can be viewed as combining elements of the first two example modes. In the example of FIG. 12 in the S1 graph, the first long pulse corresponds to a pulse according to the second mode of operation, while the three subsequent pulses refer to the first mode, the "high frequency" mode of operation (see FIG. 10). The rate between the two modes can be chosen according to the technical needs. Thus, in one example, the first pulse and the second pulse can periodically change between the first mode (FIG. 10) and the second mode (FIG. 11). The mode of FIG. 12 can be characterized accordingly by the frequency of the second mode ("main frequency") alternating with the properties of first mode, as previously described. The main frequency of a first pulse in either mode can be 1 Hz-10 kHz, with preferable examples occurring between 10 Hz to 1 kHz. In one mode, an on-time (time period of $t_1$- to) of 0.2 μs to 100 μs, preferably 2 μs to 20 μs can be used. The sub-pulse on-time of the second pulse during the first pulse off-time can be 0.2 μs to 10 μs with preferable examples between 1 μs to 5 μs. The duty cycle of the first pulse can be between 0.1% and 10% in this mode. Many examples of either mode are present, as the sub-pulse duty cycle of the second pulse during the first switch S1 off-time can have a wide range of values. For example, the sub-pulse duty cycle for the second pulse during the off-time ($\Delta t_{on}/(\Delta t_{on}+\Delta t_{off})$) can range from 0.01% to 20%. Moreover, other types of pulses can be used within the second pulse that are different than the elements in the first example mode.

Either of the examples of FIG. 10-12 can be used as a method of applying a substrate bias in an apparatus for generating sputtering where voltage pulses are applied to produce a coating on a substrate. In the example method, a first pulse is applied to a first switch to charge a magnetron from a power supply. The example method also includes the step of applying a substrate bias from an electrical bias device operably connected to the substrate. The first pulse can include the examples of FIGS. 10-12 in this example method. The electrical bias device, such as an RF generator, is operably connected to the substrate and is configured to apply the substrate bias.

Despite the technical complication of implementing additional electronics with high-voltage, high-current, relatively fast switches, as in the first example of FIG. 9, the generator of the subject invention itself can be smaller, cheaper and faster. When the time delay between the pulses is shorter, the energy delivered for charging the capacitors between the pulses is relatively smaller and the capacitors can have a relatively lower capacity, which results in relatively smaller dimensions and lower cost. The transforming effects of the coil L allow the use of a lower voltage in the power supply. Thus, the cost of the power supply can be reduced. Moreover, the smaller capacitors allow less of a delay of the regulating feedback loop.

Each of the advantages contribute to reliable, repeatable, arc-free processes that are key features for short processing (200 ms to 10 min) of substrates sensitive to particles, such as the processing of semiconductor wafers, thin film heads, MEMS, optical data storage, magnetic data storage media, or flat panel displays. Other advantages of the subject invention are related to the beneficial effects of the chopper off-time when a chopper switch S2 turns on. The switch S2 can be used as a chopper switch when it is operably connected at a point along a coil L. During the chopper off-time period, when the switch S2 is not connected, the target voltage switches to positive values. Some electrons from the plasma end on the target and the plasma potential reach positive values. The ions that were present in the sheath, pre-sheath, and in the plasma, are now accelerated from the target towards the substrates and the walls. The effect for a single pulse depends on the pulse off-time and the target voltage. The final effect depends in part on the repetition frequency. The effect depends also on the point of contact of the switch S2 along the coil L. This point of contact can be called the tap. The more windings that are present between the magnetron end of the coil L and the tap result in a higher voltage transformation effect, a higher positive voltage on target during off-time, and in higher ion energy and relatively faster depletion of the ions from the near-target region.

A method of film deposition using the second example that includes an RF bias and a switching method can be used for the metallization of a trench and a via in the processing of front-end semiconductor wafers. The method can be also used for general metallization, wetting or seed layers in deep vias in silicon, for through/wafer vias. For example, the second pulse and the position of the second switch along the inductor coil can be both adjusted to provide a desired coating for the substrate, as well as for forming one or more layers on the substrate. Examples of additional layers can be a wetting layer or a seed layer. The method can also be used for optimizing the bottom and/or sidewall coverage in the trenches and/or vias by chopper off-time and/or position of the coil tap. In another example, the method can be used to optimize the ion flux to the substrate by adjusting the chopper off-time and/or the position of the coil tap. The deposition rate can also be optimized by an adjustment of the second pulse off-time (i.e. the chopper off-time) and/or adjusting the position of the second switch along an inductor coil. Thus, different and relatively higher deposition rates can be obtained that are desirable for many applications. Using a coil with more switchable tabs, such as a coil where the point of contact with the switch S2 can be adjusted, or changing the coil L helps to find an optimum level for the apparatus. Such effects can be used to optimize the ion flux to the substrate as well as the ion energy. The bottom and sidewall coverage of trenches and vias in semiconductor wafers or other structures on substrates can be optimized as well. Furthermore, the method of using the RF generator along with pulsing can be used to optimize a film stress, a microstructure, a mechanical property, an electrical property, an optical property, and other properties of the coating by the adjustment of the second pulse (i.e. the chopper off-time) and/or the adjustment of the position of the coil tap, such as adjustment of the second switch along an inductor coil.

The abovementioned drawback of a lower specific rate in HIPIMS applications compared to DC magnetron sputtering can be partly compensated by the pulsing method of the subject invention. When the duration of the chopper on-time is comparable with the ion flight time across the target sheath and pre-sheath (in a range of approximately 0.2 µs to 5 µs), it is possible to limit a substantial part of the ionized sputtered particles from being pulled back to the target. The particles can be inhibited from being pulled back to the target by the chopper off time producing a reversed direction of electric field and acceleration before the ions reach the target.

Figure 13:
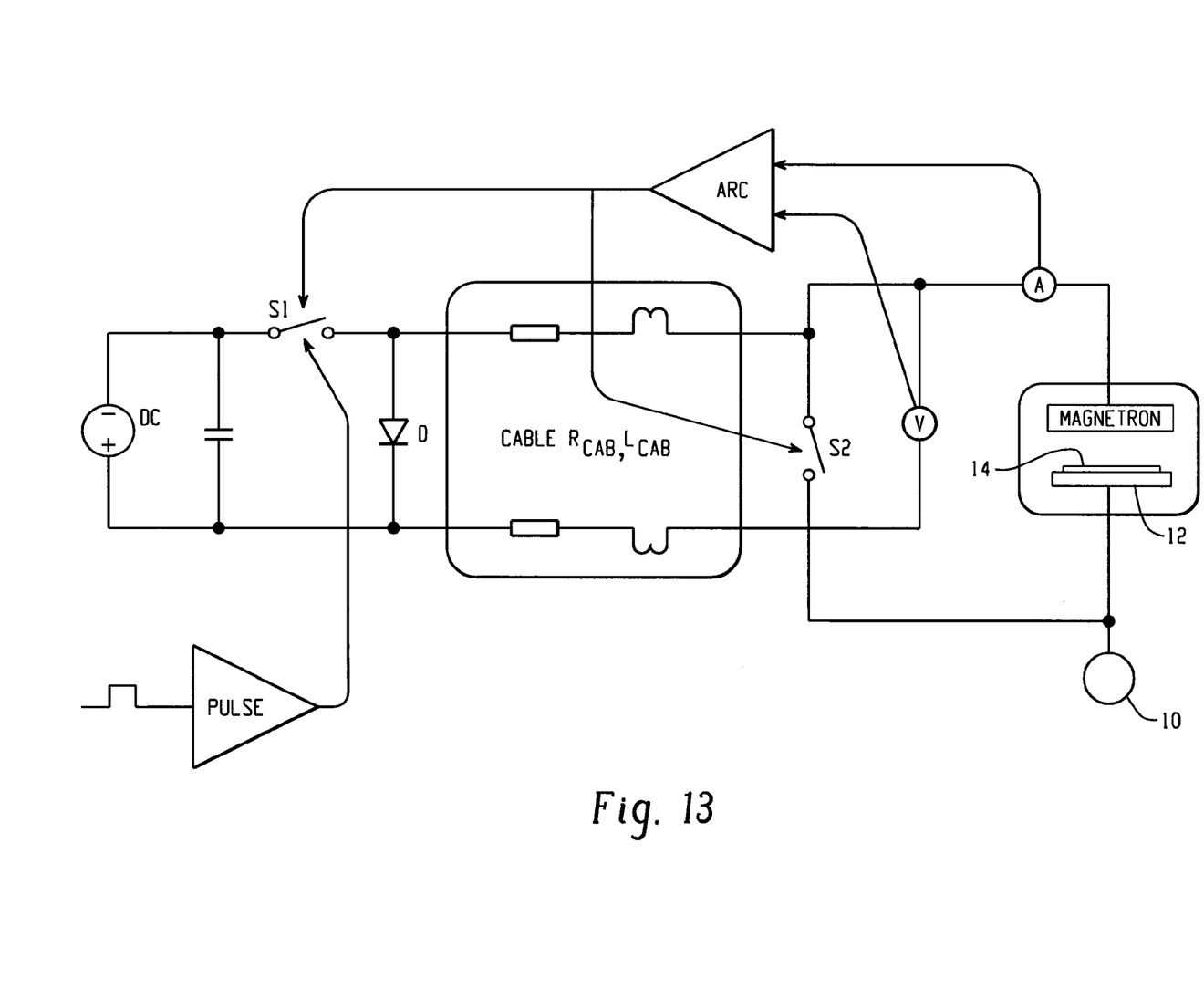
FIG. 13 is a third example schematic of the subject invention using RF bias in combination with two switches and an arc detection design.

In a third example, the method and device of the subject invention can be combined with an arc detection design, as seen in FIG. 13. The electrical bias device 10 is operably connected to the substrate 14, such as to a chuck 12 which holds the substrate 14. The basic idea is to prevent or inhibit the formation of an arc at a location close to the cathode of the magnetron after an arc is detected as the arc is forming or beginning to form. The example of FIG. 13 includes at least one detector. The detector can be a meter such as a voltage meter (V) or an amp meter (A). In other examples, the detector can be one device that can monitor amps, volts, or a plurality of indicators to detect that an arc is forming. In the example of FIG. 13, two detectors, a voltage meter (V) and an amp meter (A) are placed in close proximity to the magnetron and are operably connected to the magnetron. The voltage meter (V) and the amp meter (A) are configured for detecting an arc that is forming or beginning to form. It is appreciated that in other examples, only one detector is provided, and in other examples, further detectors can be provided in various locations, including locations in close proximity to the magnetron. When one detector is provided, it can be either a voltage meter or an amp meter that is configured to detect the arc that is forming. The example of FIG. 13 also can include a magnetron including a cathode and an anode, a target located near the magnetron and used for sputtering atoms to produce the coating on the substrate, a power supply operably connected to the magnetron, at least one capacitor C operably connected to the power supply, and a first switch S1 operably connected to charge the magnetron and configured to charge the magnetron according to a first pulse. The power supply can be a DC power supply.

A second switch S2 is placed close to the cathode of the magnetron in the example of FIG. 13. The second switch S2 is operably connected to discharge the magnetron and is configured to discharge the magnetron and inhibit the formation of an arc upon a detection of an arc forming by the at least one detector. The second switch S2 is normally open and allows for a pulsing operation. When an arc is detected, the second switch S2 switches on and makes an effective shortcut between the magnetron cathode and anode. At the same time that the second switch S2 makes a shortcut, the first switch S1 switches off. Alternatively, when the second switch S2 is turned on to make a shortcut for the energy, the first switch S1 can turn on at a short time period before or after the second switch S2 is activated. Thus, the first switch S1 can also be controlled in response to the detection of an arc forming by at least one detector. The switch S1 can be controlled to inhibit or limit the formation of the arc. Controlling the first switch in addition to the second switch provides additional control of the energy in the apparatus. An inductance, such as a coil L, can also be used with the example of FIG. 13, the arc detection example, where the coil is operably connected to the at least one capacitor C and the coil is configured to limit a rise time of a magnetron discharge current and to limit a peak current when an arc occurs.

Figure 14:
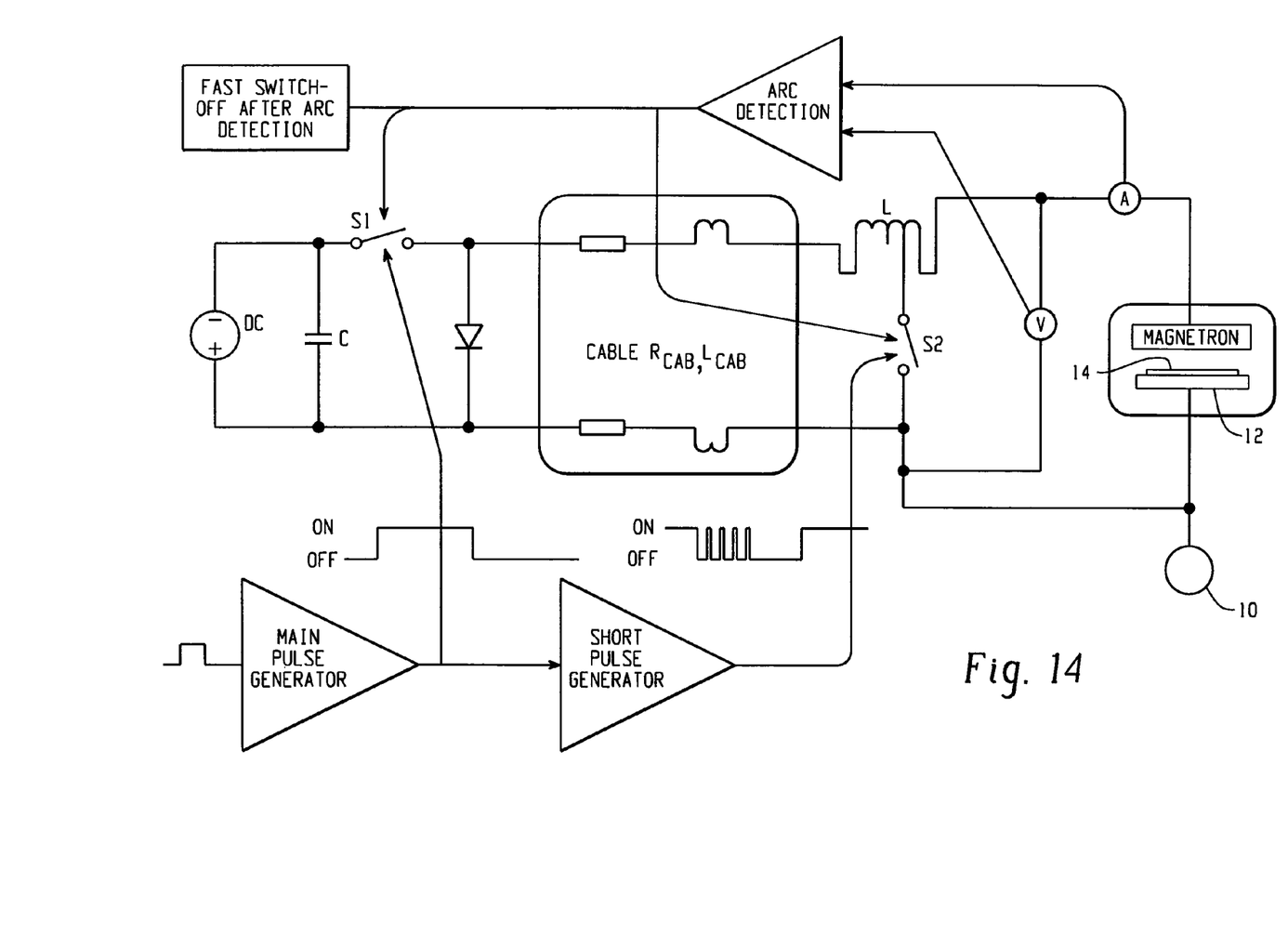
FIG. 14 is a fourth example schematic of the subject invention using RF bias in combination with two switches for applying different modes and an arc detection design.

In a fourth example, the method and device of the subject invention can be combined with a relatively fast switching power supply in a high frequency HIPIMS and with a relatively fast arc suppression design, as seen in FIG. 14. This example uses a coil L2, which can include a switch S2 connected at a point along the coil L to produce a chopper effect, in addition to the scheme shown in FIG. 13. In this example, the switch S2 is configured to administer a second pulse and is also configured to be activated to inhibit the formation of an arc upon a detection of an arc forming by at least one detector in the apparatus. In FIG. 14, the power supply charges a bank of capacitors C to a starting voltage, that is discharged into the magnetron through a cable with some inductance $L_{cab}$ and resistance $R_{cab}$. The power supply can be a DC power supply. The coil L2 has a similar functionality during HIPIMS operation as prior art designs, i.e. to limit the rise time of the magnetron discharge current. The coil L2, in FIG. 14, also limits the peak current when an arc occurs. The example of FIG. 14 also can include a magnetron including a cathode and an anode, and a target located near the magnetron and used for sputtering atoms to produce the coating on the substrate. FIG. 14 includes an arc detection apparatus that measures the current and voltage, as shown, though in other examples, only one detector is necessary to measure the arc. After the arc is detected, preferably directly at the cathode to minimize the time delay, the switch S2 switches on and makes an effective shortcut between the point along the coil L2 where the switch S2 is connected and the magnetron anode. Detection of an arc forming activates the second switch S2 to inhibit the formation of the arc. Thus, the detection reduces the harmful effects of an arc by causing the apparatus to react to the detection of an arc forming, or beginning to form. This results in an even shorter time at which the voltage on the magnetron cathode is zero, followed by positive voltage by the auto transforming effect of coil L2. The shortcut helps to extinguish the arc relatively faster.

The example of FIG. 14 is also configured to provide the pulsing method discussed for FIG. 9, where the first switch S1 charges the magnetron according to a first pulse and the second switch S2 discharges the magnetron according to a second pulse. Any of the three example modes used for FIG. 9 can be used with the two switches of FIG. 14. Moreover, this example also includes the RF generator 10 for the chuck 12 and the substrate 14.

The invention has been described with reference to the example embodiments described above. Modifications and alterations will occur to others upon a reading and understanding of this specification. Examples embodiments incorporating one or more aspects of the invention are intended to include all such modifications and alterations insofar as they come within the scope of the appended claims.

What is claimed is:

1. A method for generating sputtering of a target to produce a coating on a substrate with a current density on a cathode of a magnetron between 0.1 and 10 A/cm$^2$ comprising:
operating a power supply to charge the magnetron;
administering a first pulse to the magnetron;
discharging the magnetron according to a bias pulse from a RF electrical bias device operably connected to the substrate; and
synchronizing a frequency and a time delay of the first pulse with the bias pulse using a synchronization device operably connected to the power supply, wherein the bias pulse is administered before the first pulse with the time delay between 0.1 µs to 500 µs.

2. The method according to claim 1, wherein a duty cycle for the first pulse is between 0.01% and 20%, and the frequency in the range of 1 Hz to 20 kHz.

3. The method according to claim 1, wherein a duty cycle for the first pulse is between 2% and 50%.

4. The method according to claim 1, further comprising:
a matching unit matching a first impedance of a plasma with a second impedance of the substrate, wherein the matching unit is operably connected between RF electrical bias device and a chuck that holds the substrate.

5. The method according to claim 4, further comprising:
a monitoring device monitoring an RF self-bias at the chuck, wherein the monitoring device is operably connected to the chuck that holds the substrate and the chuck is operably connected between the RF electrical bias device and the substrate.

* * * * *

UNITED STATES PATENT AND TRADEMARK OFFICE
CERTIFICATE OF CORRECTION

| | |
|---|---|
| PATENT NO. | : 8,435,389 B2 |
| APPLICATION NO. | : 11/954490 |
| DATED | : May 7, 2013 |
| INVENTOR(S) | : Stanislav Kadlec et al. |

It is certified that error appears in the above-identified patent and that said Letters Patent is hereby corrected as shown below:

In the Specification:

Column 9 line 45, please remove "to" and add -- $t_o$ --.

Column 10 line 6, please remove "- to" and add -- - $t_o$ --.

Signed and Sealed this
Twentieth Day of August, 2013

Teresa Stanek Rea
*Acting Director of the United States Patent and Trademark Office*